United States Patent
Mathews (10) Patent No.: US 9,965,983 B2
(45) Date of Patent: May 8, 2018

(54) WATER IMMUNE KEYPAD (71) Applicant: METHODE ELECTRONICS, INC., Chicago, IL (US)

(72) Inventor: Mark R. Mathews, Lombard, IL (US)

(73) Assignee: METHODE ELECTRONICS, INC., Chicago, IL (US)

( * ) Notice: Subject to any disclaimer, the term of this patent is extended or adjusted under 35 U.S.C. 154(b) by 185 days.

(21) Appl. No.: 14/734,219

(22) Filed: Jun. 9, 2015

(65) Prior Publication Data

US 2015/0360647 A1 Dec. 17, 2015

Related U.S. Application Data (60) Provisional application No. 62/011,130, filed on Jun. 12, 2014.

(51) Int. Cl.
*G09G 3/04* (2006.01)
*G06F 3/044* (2006.01)
*H03K 17/96* (2006.01)

(52) U.S. Cl.
CPC ............. *G09G 3/04* (2013.01); *G06F 3/044* (2013.01); *H03K 17/9622* (2013.01); *H03K 2017/9602* (2013.01)

(58) Field of Classification Search
CPC ....................................................... G09G 3/04
USPC ........................................................ 345/174
See application file for complete search history.

(56) References Cited

U.S. PATENT DOCUMENTS

| | | | | |
|---|---|---|---|---|
| 9,851,856 | B2* | 12/2017 | Cordeiro | G06F 3/0416 |
| 2006/0262549 | A1* | 11/2006 | Schmidt | G07C 9/0069 |
| | | | | 362/459 |
| 2008/0042978 | A1* | 2/2008 | Perez-Noguera | G06F 3/0202 |
| | | | | 345/168 |
| 2008/0202912 | A1* | 8/2008 | Boddie | H03K 17/962 |
| | | | | 200/600 |
| 2010/0079153 | A1* | 4/2010 | Maloof | H03K 17/9622 |
| | | | | 324/658 |
| 2010/0219935 | A1* | 9/2010 | Bingle | E05B 81/76 |
| | | | | 340/5.54 |
| 2010/0296303 | A1* | 11/2010 | Sarioglu | E05B 17/10 |
| | | | | 362/487 |
| 2010/0315267 | A1* | 12/2010 | Chung | B60R 25/24 |
| | | | | 341/22 |
| 2011/0012618 | A1* | 1/2011 | Teterwak | G01D 5/24 |
| | | | | 324/607 |
| 2012/0200388 | A1* | 8/2012 | Miura | H03K 17/962 |
| | | | | 340/5.51 |
| 2015/0049057 | A1* | 2/2015 | Citta | H03K 17/962 |
| | | | | 345/174 |
| 2015/0355756 | A1* | 12/2015 | Citta | G06F 3/0416 |
| | | | | 345/174 |

* cited by examiner

*Primary Examiner* — Jason C Olson
(74) *Attorney, Agent, or Firm* — Barnes & Thornburg LLP (57) ABSTRACT

A keyless entry system for an automobile includes a capacitive touch screen having at least one drive line and at least one sense line, the drive and sense lines defining a plurality of touch detection nodes. The touch screen is associated with an exterior surface of the automobile. A control circuit coupled to the touch screen is configured to detect proximity of a stimulus to the touch detection nodes. The control circuit provides a control output to a lock or latch controller when the control circuit determines that the stimulus has been placed proximate the touch detection nodes according to predetermined criteria.

19 Claims, 6 Drawing Sheets

WATER IMMUNE KEYPAD

CROSS REFERENCE TO RELATED APPLICATION

This application claims benefit of U.S. Provisional Patent Application No. 62/011,130, filed on Jun. 12, 2014, and incorporates by reference the disclosure thereof in its entirety.

BACKGROUND OF THE INVENTION

Keyless entry systems for vehicles, for example, automobiles such as cars, trucks, and the like, are known in the art. Conventional keyless entry systems often use some form of electromechanical switch arrangement, for example, an array of membrane switches, as a means for a user to input a number combination. A control circuit detects actuations of the switches. When the control circuit determines that the switches have been actuated in a predetermined sequence, the control circuit provides a signal to a lock controller to lock, unlock, or unlatch an entry point of the vehicle, for example, a door, hatch, or tailgate of the vehicle.

Electromechanical switches have certain shortcomings, especially when used in a vehicular environment. Electromechanical switches include moving internal parts, for example, electrical contacts, that can wear out through repeated use. Also, these internal parts can corrode when exposed to the elements, as one might expect they would be when used in a vehicular environment, thereby adversely affecting their performance. Efforts have been made to encapsulate the internal parts and thereby protect them from the environment, but the encapsulation means themselves can wear out from repeated use, abuse or environmental effects, thereby negating their value in providing protection to the internal parts.

Efforts have been made to substitute discrete capacitive touch sensors for electromechanical switches in keyless entry applications. Such sensors typically include some form of discrete touch sensing electrode, for example, a conductive metal pad, for sensing touch. A control circuit provides an excitation signal to the electrode, establishing a capacitance between the touch sensing electrode and another electrode or ground (or another reference potential). Introduction of a stimulus, for example, a user's finger or other conductive object, proximate the sensing electrode alters this steady-state capacitance. The control circuit detects the capacitance and changes thereto and determines that a touch event has occurred when the capacitance changes by at least a predetermined amount from the steady-state capacitance. When the control circuit determines that the sensors have been actuated in a predetermined sequence, the control circuit provides a signal to a lock controller to lock, unlock, or unlatch an entry point of the vehicle, for example, a door, hatch, or tailgate of the vehicle.

Capacitive touch sensors typically have no moving parts, and they can be more readily protected from the environment than electromechanical switches in keyless entry applications. Nevertheless, the use of capacitive touch sensors in vehicular keyless entry systems has certain shortcomings. For example, it can be difficult to calibrate capacitive touch sensors to reliably respond to touch by both gloved and ungloved hands. Also, capacitive sensors used in vehicular keyless entry systems tend to be placed in locations where they are prone to false actuation due to the effects of contaminants such as water, road salt, dirt, other particulates, and the like. As such, known keyless entry systems using capacitive touch sensors have met with limited success.

DETAILED DESCRIPTION OF THE DRAWINGS

Figure 1:
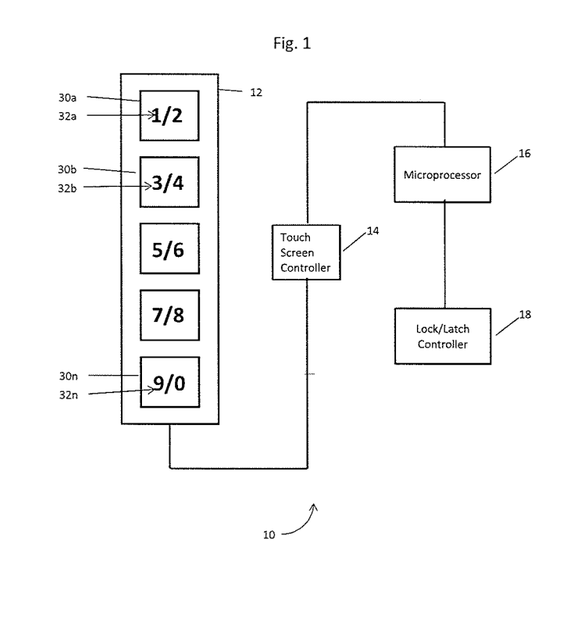
FIG. 1 is a block diagram showing an illustrative keyless entry system including a capacitive touch screen 12, a touch screen controller 14, a microprocessor 16, and a lock/latch controller 18.

The drawings show one or more illustrative embodiments of a keyless entry system 10. As best shown in FIG. 1, keyless entry system 10 may include a capacitive touch screen 12, a touch screen controller 14, a microprocessor 16 or other processor or control circuit, and a lock/latch controller 18.

Figure 2:
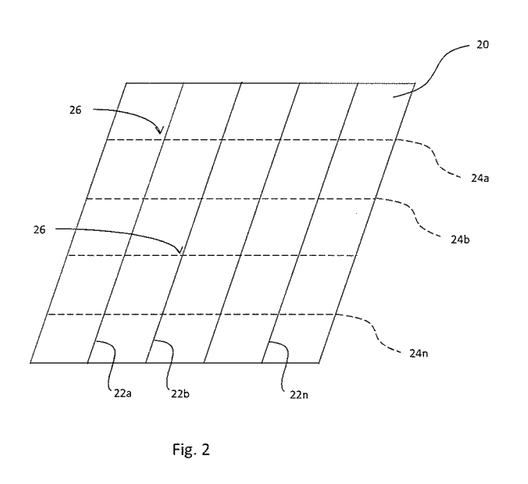
FIG. 2 is a perspective view of a portion of capacitive touch screen 12.
Figure 3:
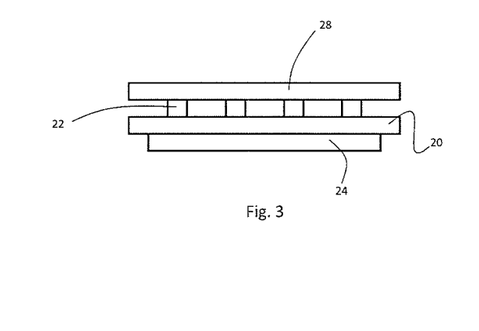
FIG. 3 is cross-sectional view of the capacitive touch screen 12 of FIG. 2.

Capacitive touch screen 12 includes a dielectric substrate 20 having a first (or upper or outer) side and a second (or lower or inner) side. Substrate 20 may be rigid or flexible. A first plurality of electrodes (sometimes referred to as "x-electrodes") 22n is disposed on the first side of dielectric substrate 20. A second plurality of electrodes (sometimes referred to as "y-electrodes") 24n is disposed on the second side of dielectric substrate 20. First electrodes 22n may be drive electrodes and second electrodes 24n may be sense electrodes, or vice versa. First electrodes 22n and second electrodes 24n are arranged so that they intersect without touching (because they are separated by dielectric substrate 20). Alternatively, first electrodes 22n and 24n could be disposed on the same side of substrate 12, with their intersections separated by a dielectric material.

The intersections of first electrodes 22n with second electrodes 24n define touch detection nodes 26. Put another way, nodes 26 represent the intersections of first electrodes 22n with second electrodes 24n wherein horizontal and vertical locations of a stimulus can be resolved to define the location where the stimulus touches or is brought into proximity with touch screen 12, as will be discussed further below. Touch screen 12 may further include electrical traces (not shown) connecting first and second electrodes 22n, 24n to touch screen controller 14.

A dielectric cover 28, for example, a piece of glass or plastic, may be provided over the first side of substrate 20 and first electrodes 22n. An adhesive or other material may be used to join cover 28 to substrate 20 and may also eliminate air gaps between cover 28 and substrate 20. A second dielectric cover (not shown) may be provided over the second side of substrate 20 and second electrodes 24n. A ground plane (not shown) may be provided on the side of the second dielectric cover opposite substrate 20. Any or all of substrate 20, first electrodes 22n, second electrodes 24n, cover 28, and second cover 34 may be, but need not be, substantially transparent, translucent, or opaque, in any combination.

As best shown in FIGS. 1 and 4-7, capacitive touch screen 12 may have an elongated form factor configured to allow definition of a plurality of touch zones 30$n$ in plural rows and a single column thereon. Alternatively, as best shown in FIG. 8, capacitive touch screen 12 may have a form factor configured to allow definition of a plurality of touch zones 30$n$ in plural rows and plural columns thereon. In FIGS. 4-8, first electrodes 22$n$ are shown as light, solid lines, second electrodes 24$n$ are shown as dashed lines, and touch detection zones 30$n$ are shown as dark, solid lines. Touch detection nodes 26$n$ are defined by the intersections of first electrodes 22$n$ and second electrodes 24$n$.

Figure 4:
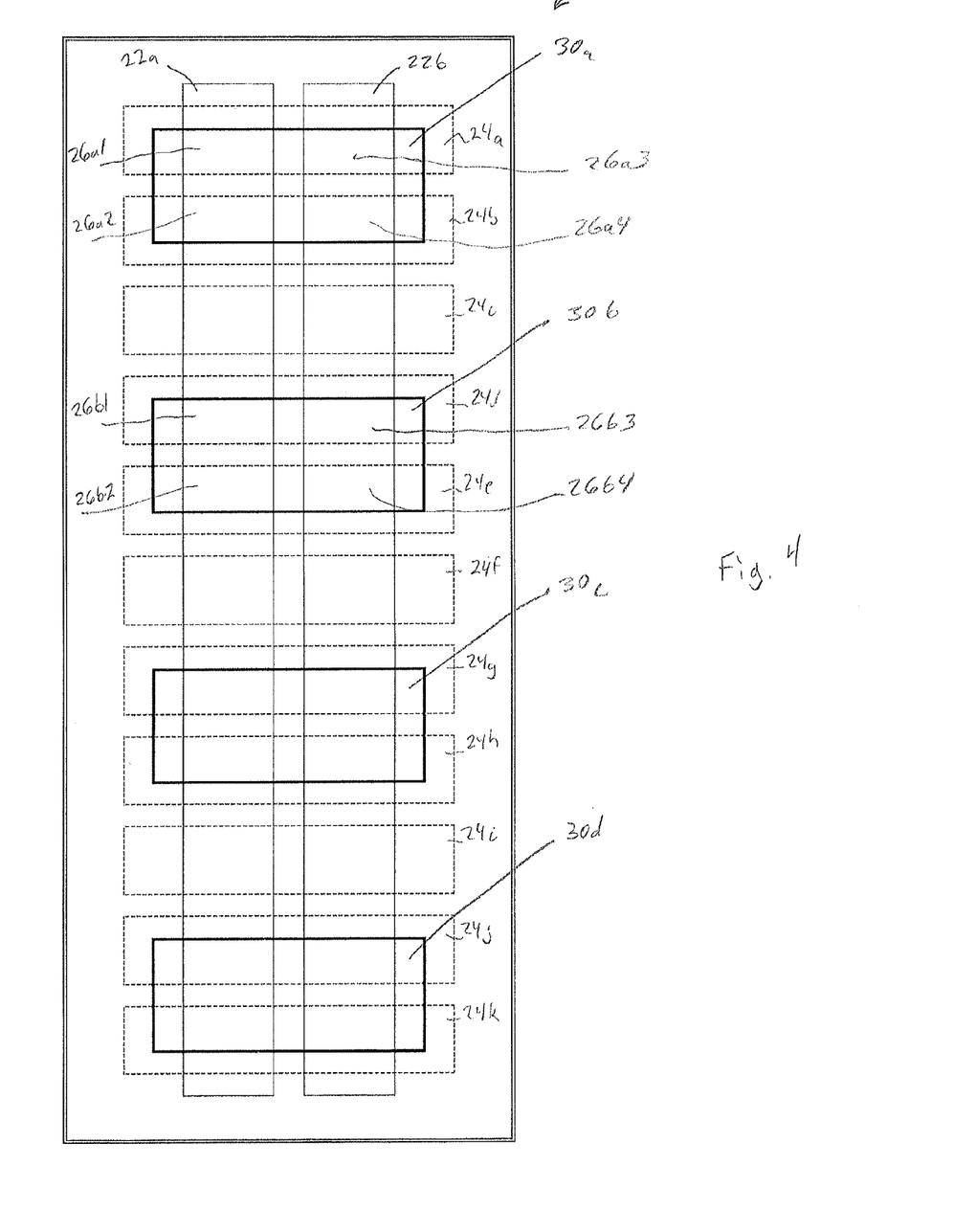
FIG. 4 is a top plan view of the electrode structure of a capacitive touch screen 12.

FIG. 4 shows capacitive touch screen 12 as including two first electrodes 22$a$-22$b$ and eleven second electrodes 24$a$-24$k$ (defining twenty-two touch detection nodes 26$n$ at the intersections thereof) and defining four touch detection zones 30$a$-30$d$ in four rows and a single column. The spacing between adjacent pairs of second electrodes 24$n$ is similar or equal. Two first electrodes 22$n$ and two second electrodes 24$n$ underlie each touch detection zone 30$n$. A single second electrode 24$n$ lies between adjacent touch detection zones 30$n$ and does not underlie either of the adjacent touch detection zones 30$n$.

More specifically, FIG. 4 shows a first set of touch detection nodes 26$a$1-26$a$4 underlying a first touch detection zone 30$a$, a second set of touch detection nodes 26$b$1-26$b$4 underlying a second touch detection zone 30$b$, a third set of touch detection nodes 26$c$1-26$c$4 underlying a third touch detection zone 30$c$, and a fourth set of touch detection nodes 26$d$1-26$d$4 underlying a fourth touch detection zone 30$d$. The touch detection nodes 26$n$ underlying first touch detection zone 30$a$ are defined by the intersections of first electrodes 22$a$ -22$b$ and second electrodes 24$a$-24$b$. The touch detection nodes 26$n$ underlying second touch detection zone 30$b$ are defined by the intersections of first electrodes 22$a$-22$b$ and second electrodes 24$d$-24$e$. The touch detection nodes 26$n$ underlying third touch detection zone 30$c$ are defined by the intersections of first electrodes 22$a$ -22$b$ and second electrodes 24$g$-24$h$. The touch detection nodes 26$n$ underlying second touch detection zone 30$b$ are defined by the intersections of first electrodes 22$a$-22$b$ and second electrodes 24$j$-24$k$. In the FIG. 4 embodiment, the touch detection nodes 26$n$ comprising second electrodes 24$c$, 24$f$, and 24$i$ do not form part of any touch detection zone.

Figure 5:
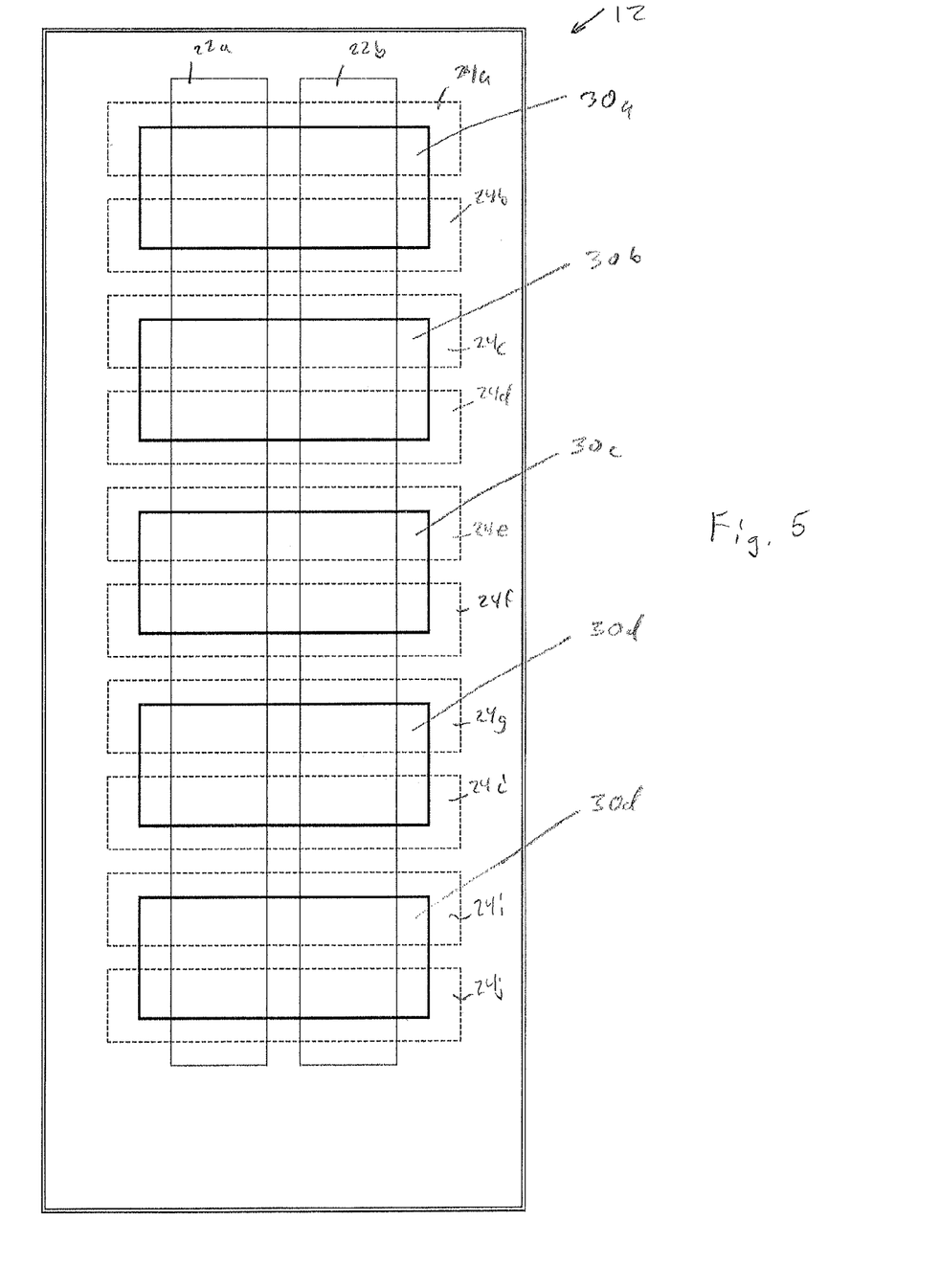
FIG. 5 is a top plan view of the electrode structure of another capacitive touch screen 12.

FIG. 5 shows capacitive touch screen 12 as including two first electrodes 22$a$-22$b$ and ten second electrodes 24$j$ (defining twenty touch detection nodes 26$n$ at the intersections thereof) and defining five touch detection zones 30$a$-30$e$ in five rows and a single column. The spacing between adjacent pairs of second electrodes 24$n$ is similar or equal. Two first electrodes 22$n$ and two second electrodes 24$n$ underlie each touch detection zone 30$n$.

Figure 6:
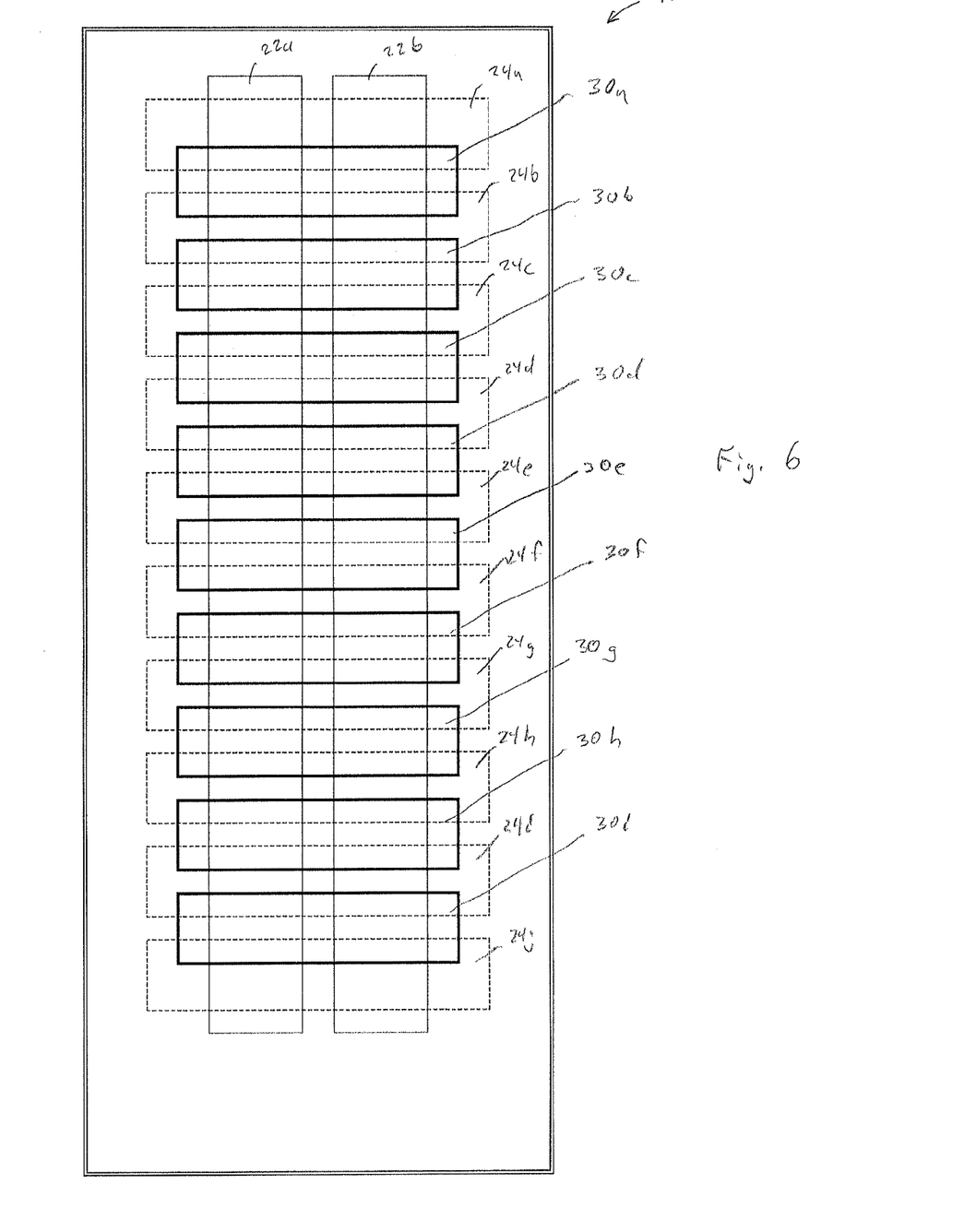
FIG. 6 is a top plan view of the electrode structure of another capacitive touch screen 12.

FIG. 6 shows capacitive touch screen 12 as including two first electrodes 22$a$-22$b$ and ten second electrodes 24$a$-22$j$ (defining twenty touch detection nodes 26$n$ at the intersections thereof) and defining nine touch detection zones 30$a$-30$i$ in ten rows and a single column. The spacing between adjacent pairs of second electrodes 24$n$ is similar or equal. Two first electrodes 22$n$ and two second electrodes 24$n$ underlie each touch detection zone 30$n$.

Figure 7:
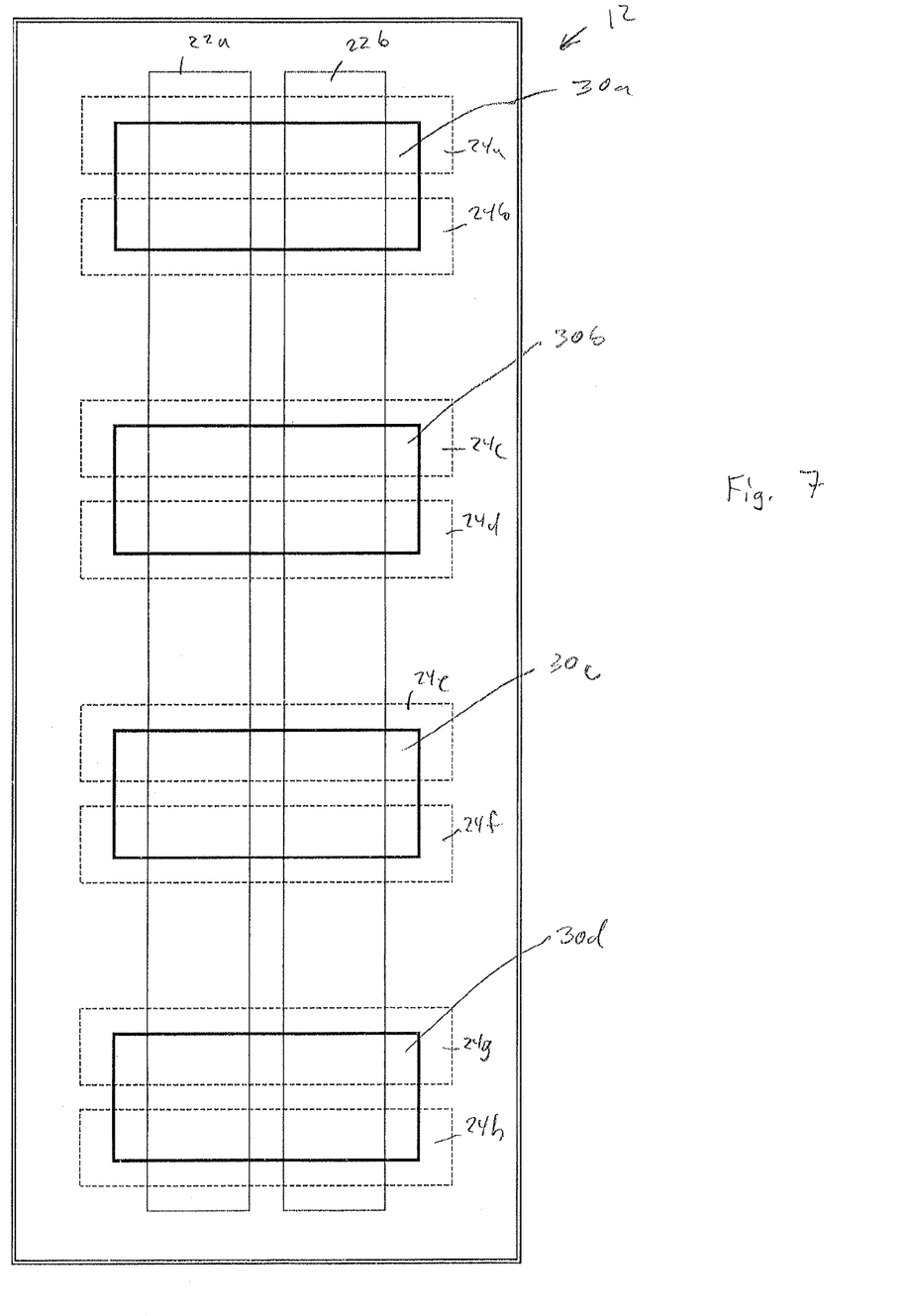
FIG. 7 is a top plan view of the electrode structure of another capacitive touch screen 12.
Figure 8:
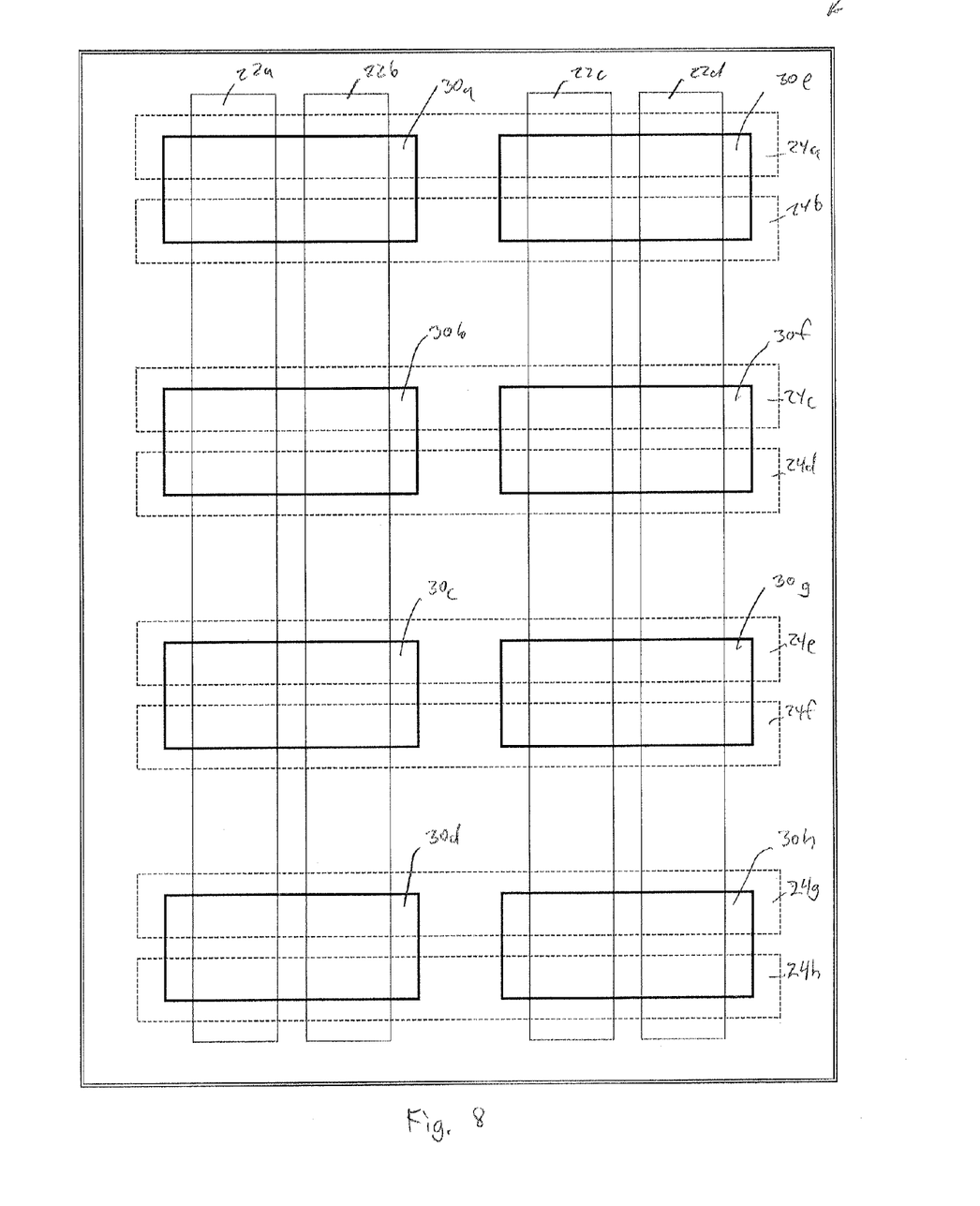
FIG. 8 is a top plan view of the electrode structure of another capacitive touch screen 12.

FIG. 7 shows capacitive touch screen 12 as including two first electrodes 22$a$-22$b$ and eight second electrodes 24$a$-24$h$ (defining sixteen touch detection nodes 26$n$ at the intersections thereof) and defining four touch detection zones 30$a$-30$d$ in eight rows and a single column. The spacing between adjacent pairs of second electrodes 24$n$ underlying respective touch detection zones 30$n$ is substantially similar or equal. The spacing between adjacent second electrodes 24$n$ of adjacent touch detection zones 26$n$ is substantially greater than the spacing between adjacent pairs of second electrodes 24$n$ underlying respective touch detection zones 30$n$. In this regard, capacitive touch screen 12 of FIG. 7 is similar to capacitive touch screen 12 of FIG. 4 except that capacitive touch screen of FIG. 7 lacks second electrodes 24$n$ between and not underlying adjacent touch zones 30$n$. Alternatively, capacitive touch screen 12 could physically include a second electrode 24$n$ between and not underlying adjacent touch zones 30$n$, with such second electrode 24$n$ between and not underlying adjacent touch zones 30$n$ not in electrical communication with touch screen controller 14 or otherwise disabled.

FIG. 8 shows capacitive touch screen 12 as including four first electrodes 22$n$ and eight second electrodes 24$n$ (defining thirty-two touch detection nodes 26$n$ at the intersections thereof) and defining eight touch detection zones 30$a$-30$h$ in four rows and two columns. The spacing between second electrodes 24$n$ of capacitive touch screen 12 and between first electrodes 22$n$ of capacitive touch screen 12 of FIG. 8 is similar to the spacing between second electrodes 24$n$ of capacitive touch screen 12 of FIG. 7.

FIGS. 4-8 show embodiments of capacitive touch screens 12 having illustrative configurations of first electrodes 22$n$, second electrodes 24$n$, and touch detection zones 30$n$. Capacitive touch screens 12 could be configured in other ways, as well, with similar or different numbers of and/or spacing between first electrodes 22$n$ and second electrodes 24$n$, and more or fewer touch detection zones 30$n$ arranged in similar or different manners. For example, touch screen 12 could define touch detection zones 30$n$ arranged in a single row and plural columns or various pluralities of rows and columns.

As best shown in FIG. 1, the general location of each touch zone 30$n$ may be identified by a corresponding hard-coded graphic 32$n$. Hard-coded graphics 32$n$ may be applied, for example, to substrate 20 or cover 28. Hard-coded graphics 32$n$ may be applied to substrate 20 or cover 28 directly or indirectly (for example, onto a decal or other medium that, in turn, is applied to substrate 20 or cover 28). Hard-coded graphics 32$n$ could be embodied as ink, frit, or any other suitable means for marking or providing indicia. Alternatively, hard-coded graphics 32$n$ could be applied by etching, for example, cover 28. In another embodiment, graphics defining touch zones 30$n$ could be generated through electronic means and displayed on capacitive touch screen in a conventional manner.

The spacing of first electrodes 22$n$ from each other, the spacing of second electrodes 24$n$ from each other, and the spacing of first electrodes 22$n$ from second electrodes 24$n$ (which is a function of the thickness of substrate 20) may be selected as desired. In an illustrative embodiment, first electrodes 22$n$ may be spaced about 10 mm or between about 5 mm to 20 mm (or a greater or lesser distance) from each other, second electrodes 24$n$ may be spaced about 10 mm or between about 5 mm to 20 mm (or a greater or lesser distance) from each other, substrate 20 may be a printed wiring board about 1.6 mm thick (and first electrodes 22$n$ are spaced from second electrodes 24$n$ accordingly), and cover 20 and/or cover 28 may be glass or plastic about 1 mm to 4 mm thick.

Touch screen controller 14 may be configured to detect touch to capacitive touch screen 12 by a user's finger or another conductive object and identify the location of such a touch. For example, touch screen controller 14 may be configured to detect touch to any of touch detection nodes 26*n* and to resolve the location of such a touch with respect to the locations of touch detection nodes 26*n*. Also, touch screen controller 14 also may be a high signal-to-noise ratio controller configured to discriminate between intentional touches thereto by, for example, a user's finger, and "false" touches thereto by, for example, water, dirt, or another contaminant. Controller 14 may include analog circuitry allowing for accurate measurement of capacitances relating to operation of a capacitive touch screen. Controller 14 may also include noise filtering algorithms and exact sampling methods in hardware, software, or firmware. In an illustrative embodiment, touch screen controller 14 may be a maXTouch controller, marketed by Atmel Corporation of San Jose, Calif., configured to resolve as least as many touch detection nodes 26*n* as may be provided in connection with capacitive touch screen 12. Touch screen controller 14 may be configured to provide an output indicative of whether, where, and/or when touch has occurred to capacitive touch screen 12.

Microprocessor 16 may be configured to receive touch data from touch screen controller 14 and map the touch location(s) with respect to the locations of touch detection zones 30*n*. The locations of touch detection zones 30*n* may be predetermined and fixed with respect to the form of capacitive touch screen 12 and stored in memory accessible to microprocessor 16. Also, microprocessor 16 could be configured to provide a control output to a controlled device or controller, for example, lock/latch controller 18 when certain predetermined conditions are met.

In use, touch screen controller 14 selectively energizes first electrodes 22*n*, thereby establishing baseline capacitances at each touch detection node 26*n*. Touch screen controller 14 also monitors the capacitances at each at each touch detection node 26*n* and determines that a touch event has occurred at a touch detection node 26*n* when the capacitance at the touch node 26*n* varies from (for example, rises above or falls below) the baseline capacitance by at least a predetermined amount. Touch screen controller 14 may do so using principles and operating methodology of mutual capacitance, for example, as discussed above, where first electrodes 22*n* are drive electrodes and second electrodes 24*n* are sense electrodes. Alternatively, touch screen controller 14 could do so using principles and operating methodology of, for example, self-capacitance, where both first electrodes 22*n* and second electrodes may function as drive electrodes and sense electrodes.

Microprocessor 16 receives the touch detection information from touch screen controller 14 and determines that a touch event (resulting from a deliberate touch or proximity of a stimululus, for example, a user's finger or other conductive object, rather than a contaminant) has occurred at a particular touch detection zone 30*n* if certain predetermined criteria are met. For example, microprocessor 16 could determine that a touch event has occurred at a particular touch detection zone 30*n* if touch screen controller 14 has determined that touch has occurred at a first predetermined number of the touch detection nodes 26*n* underlying the particular touch detection zone 30*n* within a first predetermined time. The first predetermined number could be a specific number or a minimum number, for example, one, two, three, or more. As a more specific example, with respect to the FIG. 4 embodiment, microprocessor 16 could determine that a touch event has occurred at touch detection zone 30*a* if touch screen controller 14 has determined that touch has occurred at one or more of touch detection nodes 26*a*1-26*a*4 within a first predetermined time. This example is illustrative and not limiting.

Also, microprocessor 16 could determine that a touch event has not occurred at a particular touch detection zone 30*n*, even if touch screen controller 14 has determined that touch has occurred at a first predetermined number of touch detection nodes 26*n* underlying the particular touch detection zone 30*n*, if touch screen controller 14 also has determined that touch has occurred at a second predetermined number or more of touch detection zones 26*n* not underlying the particular touch detection zone 30*n* within the first predetermined time or another predetermined time. The second predetermined number could be as low as zero or as high as may be practical or desired for a particular application. As a more specific example, again with respect to the FIG. 4 embodiment, microprocessor 16 could determine that a touch event has not occurred at touch detection zone 30*a*, even if touch screen controller 14 has determined that touch has occurred at one or more of touch detection nodes 26*a*1-26*a*4 within a first predetermined time, if touch screen controller 14 also has detected touch to any one or more (or a specific one or more) of touch detection nodes 26*n* not underlying touch detection zone 30*a* within the first predetermined time or another predetermined time. This example is illustrative and not limiting.

If microprocessor 16 determines that touch events have occurred at a predetermined number of touch detection zones in a predetermined sequence within a predetermined period of time, microcontroller 16 could provide a signal to lock/latch controller 18 indicating that lock/latch controller should cause a lock to change state from locked to unlocked or vice versa, or a latch to release or unlatch.

The embodiments shown and described herein are illustrative and not limiting. One skilled in the art would recognize that features shown in connection one embodiment could be combined with features of another embodiment and that aspects of the embodiments shown and discussed herein could be modified without departure from the scope of the appended claims.

The invention claimed is:

1. A method of using a capacitive touch screen in a keyless entry system for a vehicle, said capacitive touch screen having a form and comprising at least one first electrode and at least two second electrodes defining a plurality of touch detection nodes at respective intersections of said at least one first electrode and said at least two second electrodes, said method comprising the steps of:

associating said capacitive touch screen with an exterior surface of said vehicle;

defining a plurality of touch detection zones on said capacitive touch screen, each of said touch detection zones overlying corresponding plural ones of said touch detection nodes;

associating a touch screen controller with said capacitive touch screen, said touch screen controller configured to detect touch or proximity of a stimulus to ones of said plurality of touch detection nodes and to provide an output indicative of said touch or proximity and the location of said touch or proximity with respect to the form of said touch screen; and associating a control circuit with said touch screen controller, said control circuit configured to provide a control output only when said touch screen controller detects touch to a first predetermined number of said touch detection nodes underlying a specific one of said plurality of touch detection zones within a predetermined time.

2. The method of claim 1, said control circuit further configured to not provide said control output if said touch screen controller detects touch to a second predetermined number of said touch detection nodes not underlying said specific one of said plurality of touch detection zones within said predetermined time.

3. A method of using a capacitive touch screen in a keyless entry system for a vehicle, said capacitive touch screen having a form and comprising at least one first electrode and at least two second electrodes defining a plurality of touch detection nodes at respective intersections of said at least one first electrode and said at least two second electrodes, said method comprising the steps of:
  associating said capacitive touch screen with an exterior surface of said vehicle;
  defining a plurality of touch detection zones on said capacitive touch screen, each of said touch detection zones overlying corresponding ones of said touch detection nodes;
  associating a touch screen controller with said capacitive touch screen, said touch screen controller configured to detect touch or proximity of a stimulus to ones of said plurality of touch detection nodes and to provide an output indicative of said touch or proximity and the location of said touch or proximity with respect to the form of said touch screen; and
  associating a control circuit with said touch screen controller, said control circuit configured to provide a control output only if said touch screen controller first detects touch to a first predetermined number of said touch detection nodes underlying a specific one of said plurality of touch detection zones within a predetermined time and said touch screen controller then detects touch to a first predetermined number of said touch detection nodes underlying a second specific one of said plurality of touch detection zones within a further predetermined time.

4. The method of claim 3 wherein said control output causes locking or unlocking of an entry point of said vehicle.

5. The method of any preceding claim 4 wherein said capacitive touch screen is disposed upon a surface of a said vehicle.

6. A method of using a capacitive touch screen in a keyless entry system for a vehicle, said capacitive touch screen having a form and comprising at least one first electrode and at least two second electrodes defining a plurality of touch detection nodes at respective intersections of said at least one first electrode and said at least two second electrodes, said method comprising the steps of:
  associating said capacitive touch screen with an exterior surface of said vehicle;
  defining a plurality of touch detection zones on said capacitive touch screen, each of said touch detection zones overlying corresponding ones of said touch detection nodes;
  associating a touch screen controller with said capacitive touch screen, said touch screen controller configured to detect touch or proximity of a stimulus to ones of said plurality of touch detection nodes and to provide an output indicative of said touch or proximity and the location of said touch or proximity with respect to the form of said touch screen; and
  associating a control circuit with said touch screen controller, said control circuit configured to provide a control output only if said touch screen controller first detects touch to a first predetermined number of said touch detection nodes underlying a specific one of said plurality of touch detection zones within a predetermined time and said touch screen controller then detects touch to a first predetermined number of said touch detection nodes underlying a second specific one of said plurality of touch detection zones within a further predetermined time;
  said control circuit further configured to not provide said control output if said touch screen controller detects touch to a second predetermined number of said touch detection nodes not underlying said specific one of said plurality of touch detection zones within said predetermined time.

7. The method of claim 1 wherein said at least one first electrode comprises at least one drive line and said at least two second electrodes comprises at least two sense lines.

8. The method of claim 1 wherein said at least two second electrodes comprise at least two drive lines and said at least one first electrode comprises at least one sense line.

9. The method of claim 1 wherein said control circuit comprises a high signal-to-noise ratio touch screen controller.

10. The method of claim 9 wherein the touch screen controller comprises analog circuitry and noise filtering algorithms.

11. The method of claim 1 wherein said capacitive touch screen further comprises hard coded graphics identifying the location of said plurality of touch detection zones.

12. A keyless entry system for a vehicle, comprising:
  a capacitive touch screen having a form, the touch screen comprising a dielectric substrate having a first side and a second side, at least one drive line disposed on said first side of said dielectric substrate and at least one sense line disposed on said second side of said dielectric substrate, said at least one drive line and said at least one sense line defining a plurality of touch detection nodes, said capacitive touch screen associated with an exterior surface of said vehicle, said capacitive touch screen defining a plurality of touch detection zones, each of said touch detection zones overlying corresponding ones of said touch detection nodes;
  a touch screen controller electrically coupled to said capacitive touch screen, said touch screen controller configured to detect touch or proximity of a stimulus to ones of said plurality of touch detection nodes and to provide an output indicative of said touch or proximity and the location of said touch or proximity with respect to the form of said touch screen; and
  a control circuit electrically coupled to said touch screen controller, said control circuit configured to provide a control output only when said touch screen controller detects touch to a first predetermined number of said touch detection nodes underlying a specific one of said plurality of touch detection zones within a predetermined time.

13. The system of claim 12, said control circuit further configured to not provide said control output if said touch screen controller detects touch to a second predetermined number of said touch detection nodes not underlying said specific one of said plurality of touch detection zones within said predetermined time.

14. The system of claim 13 wherein said control output causes locking or unlocking of an entry point of said vehicle.

15. A method of using a capacitive touch screen in a keyless entry system for a vehicle, said capacitive touch screen having a form and comprising at least one first electrode and at least two second electrodes defining a plurality of touch detection nodes at respective intersections of said at least one first electrode and said at least two second electrodes, said method comprising the steps of:

associating said capacitive touch screen with an exterior surface of said vehicle;

defining a plurality of touch detection zones on said capacitive touch screen, each of said touch detection zones overlying corresponding ones of said touch detection nodes;

associating a touch screen controller with said capacitive touch screen, said touch screen controller configured to detect touch or proximity of a stimulus to ones of said plurality of touch detection nodes and to provide an output indicative of said touch or proximity and the location of said touch or proximity with respect to the form of said touch screen; and associating a control circuit with said touch screen controller, said control circuit configured to provide a control output only if said touch screen controller first detects touch to a first predetermined number of said touch detection nodes underlying a specific one of said plurality of touch detection zones within a predetermined time and said touch screen controller then detects touch to a first predetermined number of said touch detection nodes underlying a second specific one of said plurality of touch detection zones within a further predetermined time;

said control circuit further configured to not provide said control output if said touch screen controller detects touch to a second predetermined number of said touch detection nodes not underlying said specific one of said plurality of touch detection zones within said predetermined time.

16. The system of claim 12 further comprising hard coded graphics disposed on said capacitive touch screen, said hard coded graphics identifying the location of said plurality of touch detection zones.

17. The system of claim 12, said touch detection zones arranged in plural rows and a single column on said capacitive touch screen.

18. The system of claim 12, said touch detection zones arranged in a single row and plural columns on said capacitive touch screen.

19. The system of claim 12, said touch detection zones arranged in plural rows and plural columns on said capacitive touch screen.

* * * * *